US008618651B1

(12) United States Patent
Yee

(10) Patent No.: US 8,618,651 B1
(45) Date of Patent: Dec. 31, 2013

(54) BURIED TSVS USED FOR DECAPS

(71) Applicant: Nvidia Corporation, Santa Clara, CA (US)

(72) Inventor: Abraham F. Yee, Cupertino, CA (US)

(73) Assignee: Nvidia Corporation, Santa Clara, CA (US)

( * ) Notice: Subject to any disclaimer, the term of this patent is extended or adjusted under 35 U.S.C. 154(b) by 0 days.

(21) Appl. No.: 13/666,850

(22) Filed: Nov. 1, 2012

(51) Int. Cl.
*H01L 23/04* (2006.01)

(52) U.S. Cl.
USPC .................. 257/698; 257/774; 257/E23.011; 257/E23.174; 257/E21.597; 438/667

(58) Field of Classification Search
USPC .................. 257/698, 774, E23.011, E23.174, 257/E21.597; 438/667
See application file for complete search history.

(56) References Cited

U.S. PATENT DOCUMENTS

| 8,080,445 | B1* | 12/2011 | Pagaila | 438/106 |
| 8,344,512 | B2* | 1/2013 | Knickerbocker | 257/773 |
| 2012/0248629 | A1* | 10/2012 | Knickerbocker et al. | 257/777 |

* cited by examiner

*Primary Examiner* — Trung Q Dang
(74) *Attorney, Agent, or Firm* — Patterson & Sheridan, L.L.P.

(57) ABSTRACT

An interposer having decaps formed in blind-vias, a packaged semiconductor structure having decaps formed in blind-vias, and methods for forming the same are provided. In one embodiment, an interposer is provided that includes an interconnect layer disposed on a substrate. A plurality of through-vias are formed through the substrate in an isolated region of the substrate. At least one of the plurality of conductive vias are electrically coupled to at least one of a plurality of top wires formed in the interconnect layer. A plurality of blind-vias are formed through the substrate in a dense region of the substrate during a common etching step with the through-vias. At least one blind-via includes (a) a dielectric material lining the blind-vias, and (b) a conductive material filling the lined blind-vias and forming a decoupling capacitor.

15 Claims, 5 Drawing Sheets

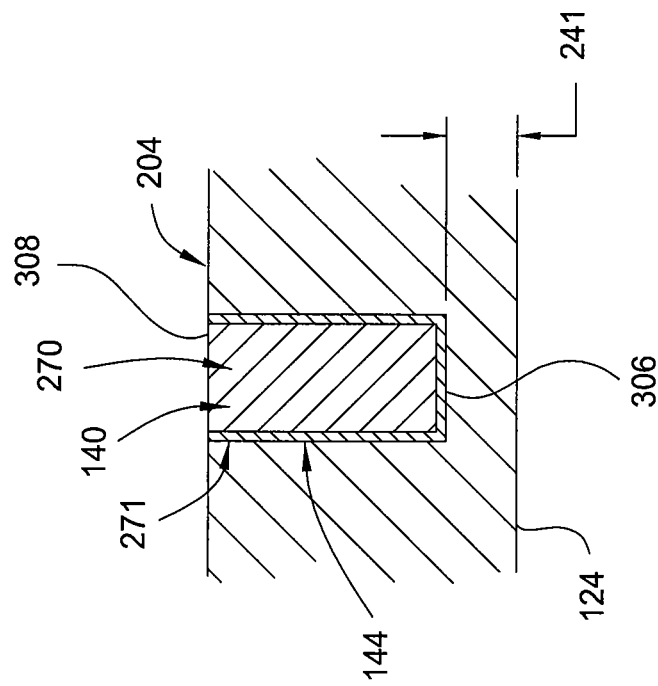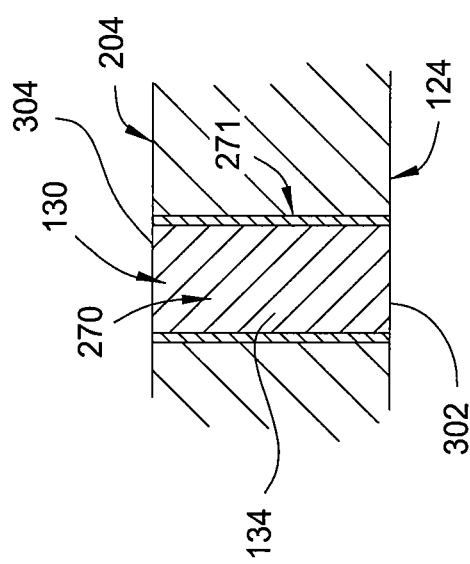
FIG. 3B
FIG. 3A

BURIED TSVS USED FOR DECAPS

BACKGROUND OF THE INVENTION

1. Field of the Invention

Embodiments of the present invention relate generally to integrated circuit chip packaging and, more specifically, a method for creating decoupling capacitors (decaps) with buried through-silicon vias (B-TSVs) in a packaging substrate and a cost effective process for manufacturing B-TSVs decaps by leveraging an etch loading effect.

2. Background

In the packaging of integrated circuit (IC) chips, one or more IC chips are usually mounted on a top surface of a packaging substrate. Through silicon vias (TSVs) provide vertical pathways to facilitate electrical connections of the IC chip to a motherboard or other printed circuit board (PCB). To accommodate multiple device dies, an interposer is typically used to bond device dies thereon, with through silicon vias (TSVs) formed in the interposer. Generally, TSV interposer has emerged as a good solution to provide high wiring density interconnection, minimizing coefficient of thermal expansion mismatch between the copper/low-k die and the copper filled TSV interposer and improving electrical performance due to shorter interconnection distances from the chip to the substrate.

Through silicon vias (TSVs) in the interposer are usually formed by etching silicon material through the interposer. Strict control of the etch rate and profile is required for TSVs to be properly formed. The etch rate of silicon depends in part on the total exposed area of the vias being formed in a unit substrate area. The variation in the etch rate dependent on differences in local amount exposed area of the vias per unit substrate area is called microloading. For example, regions having a large amount of exposed via area per unit substrate area will generally etch slower than regions having a small amount of exposed via area per unit substrate area due to microloading. The microloading effect may cause TSVs formed in a dense pattern to have a 10 percent etch rate reduction as compared to TSVs formed in an isolated (i.e., less dense) pattern. The variation in etch rate may cause blind-vias (i.e., vias that do not extend completely through the silicon) to be formed. Conventionally, blind-vias formed while etching TSVs are of little value, and can contribute to defects in the overall package structure.

To eliminate blind-vias, fabricators perform additional and complicated process steps after the typical TSV etching process in order to open up the blind-vias so that they may be utilized to form a complete set of through vias. The additional process step of opening the blind-vias to convert them to through vias is expensive, and may also risk the introduction of process defects which may undesirably decrease production yields.

SUMMARY OF THE INVENTION

Embodiments of the invention include an interposer having decaps formed in blind-vias formed while etching through vias by leveraging a microloading effect, a packaged semiconductor structure having decaps formed in blind-vias, and methods for forming the same. In one embodiment, an interposer suitable for use in a packaging substrate is provided that includes an interconnect layer disposed on a substrate comprising a silicon material. A bottom surface of the substrate defines a PCB mounting surface. The interconnect layer includes conductive and dielectric layers patterned to form a plurality of top wires. A top surface of the interconnect layer defines a chip mounting surface. A plurality of through-vias are formed through the substrate in an isolated region of the substrate. At least one of the plurality of conductive vias are electrically coupled to at least one of the top wires. A plurality of blind-vias are formed through the substrate in a dense region of the substrate. The through-vias and blind vias are formed during a common etching step. At least one blind-via includes (a) a dielectric material lining the blind-vias, and (b) a conductive material filling the lined blind-vias and forming a decoupling capacitor.

In another embodiment, a packaged semiconductor structure is provided that includes an interposer disposed on a packaging substrate, and at least a first IC chip mounted on and electrically coupled to the interposer. The interposer includes an interconnect layer disposed on a substrate comprising a silicon material. A bottom surface of the substrate defines a PCB mounting surface. The interconnect layer includes conductive and dielectric layers patterned to form a plurality of top wires. A top surface of the interconnect layer defines a chip mounting surface. A plurality of through-vias are formed through the substrate in an isolated region of the substrate. At least one of the plurality of conductive vias are electrically coupled to at least one of the top wires. A plurality of blind-vias are formed through the substrate in a dense region of the substrate. The through-vias and blind vias are formed during a common etching step. At least one blind-via includes (a) a dielectric material lining the blind-vias, and (b) a conductive material filling the lined blind-vias and forming a decoupling capacitor.

In yet another embodiment of the invention, a method for forming a structure having decoupling capacitors is provided that includes performing an etching process to form vias in a plurality of regions of a silicon substrate, at least a first region having a via density per unit area greater than a second region, lining the vias with a dielectric material, depositing a conductive material to fill the lined vias, and thinning back the substrate to form conductive vias extending from a top of the substrate to a bottom of the substrate in the second region, and to form decaps in blind-vias in the first region.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

FIG. 3A illustrates a partial sectional view of a via from the low via density region of the substrate, according to an embodiment of the invention;

FIG. 3B illustrates a partial sectional view of a blind-via from a high via density region of the substrate, according to an embodiment of the invention;

For clarity, identical reference numbers have been used, where applicable, to designate identical elements that are common between figures. It is contemplated that features of one embodiment may be incorporated in other embodiments without further recitation.

DETAILED DESCRIPTION

Embodiments of the invention utilized formerly undesirable blind-vias to form embedded decoupling capacitors (decaps) in the TSV interposer to improve electrical performance. By forming decaps utilizing the blind-vias formed while etching through vias, additional process steps normally utilized to open the blind-vias may be eliminated while beneficially adding decaps to improve electrical performance.

Embodiments of the invention include an interposer having decaps formed in blind-vias, a packaged semiconductor structure having decaps formed in blind-vias, and methods for forming the same. The blind-via is formed while forming a silicon through via (TSV) during a single (e.g., common) etch process by leveraging a microloading effect. By forming both the TSVs and blind-vias simultaneously, package fabrication costs are reduced while enhancing electrical performance of the resultant package structure. In one embodiment, the microloading effect for etching vias in an interposer is leveraged to strategically produce an isolated region of TSVs and a dense region of blind-vias in a single etch operation.

Figure 1:
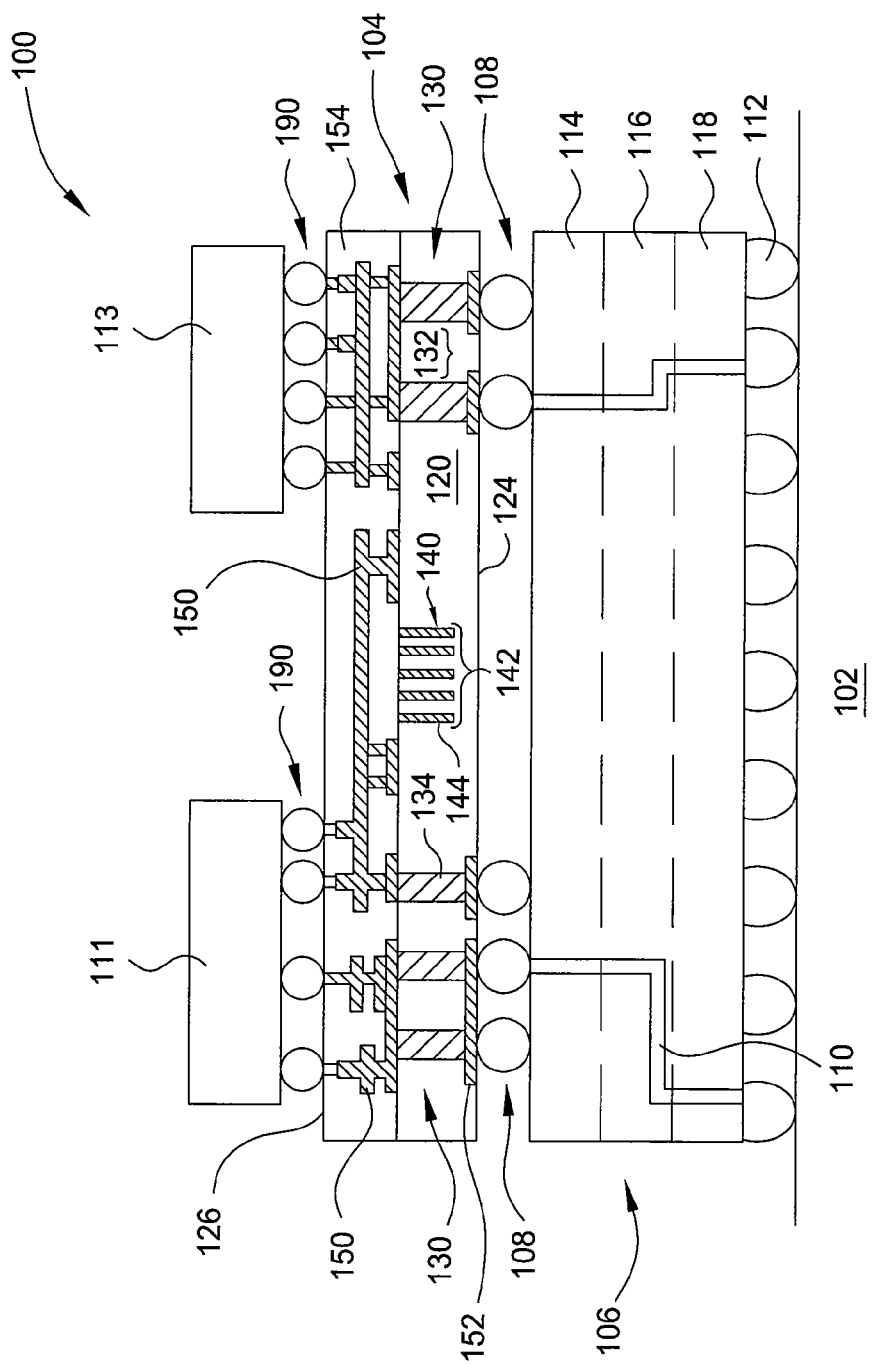
FIG. 1 illustrates a side schematic view of a packaged semiconductor device disposed on a printed circuit board PCB, the packaged semiconductor device including an interposer having two distinct regions of different silicon via densities, according to an embodiment of the invention.

FIG. 1 is a top view of a packaged semiconductor device 100 disposed on a printed circuit board (PCB) 102. The packaged semiconductor device 100 includes an interposer 104 disposed on a packaging substrate structure 106 on the PCB 102. At least two IC chips 111, 113 are disposed on the interposer 104 through micro-bumps 190 connected to top wires 150 formed on a interconnect layer 154 of the interposer 104. The IC chips 111, 113 may be positioned on the interposer 104 by a side by side or other configuration. Although two IC chips 111, 113 are shown in the embodiment depicted in FIG. 1, additionally IC chips may be disposed on the interposer 104, or vertically stacked on the IC chips 111, 113 as needed. The IC chips 111, 113 may by a central processing unit, a graphics processing unit, a memory chip, or other integrated circuit.

The packaging substrate structure 106 includes a core layer 116 sandwiched between build-up layers 114, 118. The core layer 116 provides mechanical rigidity to the packaging substrate structure 106, while the build-up layers 114, 118 allow routing of a plurality of conductive circuits 110 formed in the packaging substrate structure 106 to be routed in a predefined configuration. Only two conductive circuits 110 are shown in phantom in FIG. 1 to avoid drawing clutter. The conductive circuits 110 disposed through the substrate structure 106 electrically connect the interposer 104 though solder micro bumps 108. The solder micro bumps 108 provide the electrical connection between the interposer 104 and the conductive circuits 110 of the substrate structure 106, while solder bumps 112 provide the electrical connection between the conductive circuits 110 of the substrate structure 106 and the PCB 102.

The interposer 104 includes an interconnect layer 154 disposed on a substrate 120. The substrate 120 is comprised of at least one layer of silicon material. The interconnect layer 154 includes conductive and dielectric layers patterned to form a plurality of top wires 150. The interposer 104 generally includes a bottom surface 124 defined by the exposed surface of the substrate 120 and a top surface 126 defined by the exposed surface of the interconnect layer 154. The bottom surface 124 faces the packaging substrate structure 106. The bottom surface 124 generally defines a defining a PCB mounting surface for electrically coupling the interposer 104 to the PCB 102. The top surface 126 generally defines a chip mounting surface on which a bottom surface of one or more IC chips, such as the IC chips 111, 113 shown in FIG. 1, are coupled. The top surface 126 may also face a heat sink (not shown).

The substrate 120 includes a plurality of vias. Vias 130 (e.g., through silicon vias (TSVs)) extending completely through substrate 120 are utilized as conductive vias 134 to couple top wires 150 the interposer 104 to the packaging substrate structure 106 through bottom wires 152 formed on the bottom surface 124 of the substrate 120. Blind-vias 140 not extending completely through the substrate 120 are utilized as decaps 144 to enhance the electrical performance of the interposer 104.

The TSVs 130 are formed in regions 132 of the substrate 120 having a low density of via exposed (i.e., cross sectional) area per unit area of the substrate 120. The conductive vias 134 generally are open to the bottom surface 124 of the interposer 104, and extend completely through the substrate 120 of the interposer 104. The density of the exposed via may be effected by a number of factors, including one or more of via diameter, via center to center spacing, and the number of vias per unit substrate area.

The blind-vias 140 are formed in regions 142 of the substrate 120 having a high density of exposed via area per unit area of the substrate 120 as compared to the via density of the isolated regions 132. Bottoms of the decaps 144 are generally isolated from, i.e., spaced from, the bottom surface 124 of the interposer 104.

Figure 2:
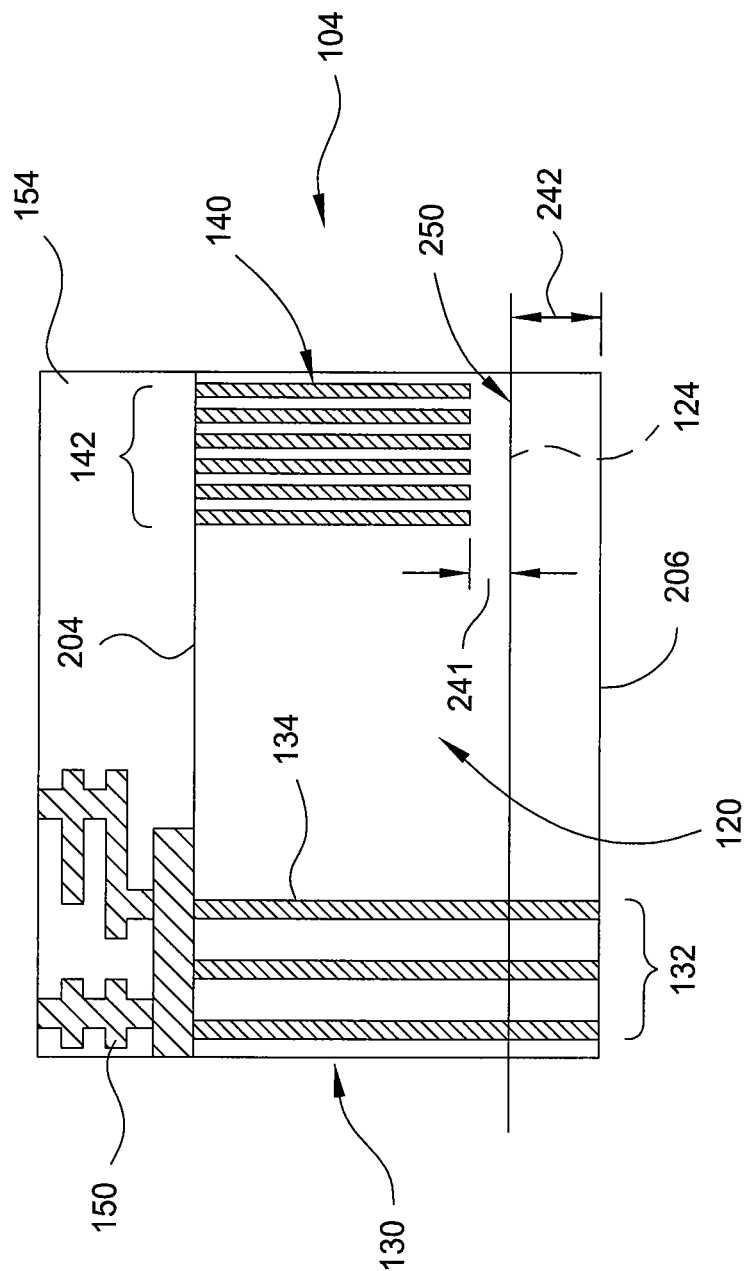
FIG. 2 illustrates a sectional view of a portion of a substrate used to form the decaps in the interposer illustrated in FIG. 1.

FIG. 2 is a sectional view of a portion of the substrate 120 shown in FIG. 1, prior to completely forming the conductive vias 134 in the TSVs 130 and the decaps 144 in the blind-vias 140 and after forming the interconnect layer 154. Alternatively, the interconnect layer 154 may be formed subsequently to completion the conductive vias 134 formed in the TSVs 130 and the decaps 144 formed in the blind-vias 140. The substrate 120 generally includes a top 204 and a bottom 206. The substrate 120 is generally formed from a silicon containing material, such as silicon, or other material suitable for integrated circuit manufacture. In one embodiment, the substrate 120 is formed from a doped silicon containing material, such as n-doped or p-doped silicon. In a particular embodiment, the substrate 120 in the dense region 142 comprises p-doped silicon.

The TSVs 130 and the blind-vias 140 are formed in the top 204 of the substrate 120 using a single etch process, i.e., they are formed simultaneously. In one embodiment, the TSVs 130 and the blind-vias 140 are formed by plasma etching, for example, with a halogen containing gas. The plasma etch process may be a cyclical process, such as a BOSCH etch process. The TSVs 130 are etched at least to a depth that leaves less than or equal to a predetermined distance 242 from the bottom 206 of the substrate 120. In one embodiment, the predetermined distance 242 of substrate material may be later removed from the bottom 206 of the substrate 120 using a suitable material removal process, such as a chemical mechanical polishing (CMP) process, to thin the substrate thickness and also to expose the TSVs 130 in the isolated region 132 in the case where some of the TSVs 130 are not completely etched through. The TSVs 130 in the isolated region 132 may alternatively etched to break through the bottom 206 of the substrate 120.

Due to the microloading effect between vias formed in the regions 132, 142 of different via density, a slower etching rate is realized in the dense region 142 of substrate 120, thereby resulting in forming blind-vias 140 in the dense region 142. The blind-vias 140 are only etched to a depth that leaves more than the predetermined distance 242 from the bottom 206 of the substrate 120, thereby making the depth of the blind-vias 140 in the dense region substantially shorter than the isolated region TSVs 130. In other words, the difference in depth is achieved by simultaneously etching both the TSVs 130 and the blind-vias 140 during a single etch process, wherein the microloading effect due to the TSVs 130 residing in an isolated region 132 and the blind-vias 140 residing in a dense region 142 advantageously produces a pronounced difference in etch rates between the regions 132, 142.

After etching, the bottom 206 of the substrate 120 is thinned back the predefined distance 242 to a thin-back line 250. The thin-back line 250, after removing the material at the bottom 206 of the substrate 120, becomes the bottom 124 of the interposer 104. The bottom 206 of the substrate 120 may be removed (i.e., thinned back) to the thin-back line 250 using a suitable material removal process, such as chemical mechanical polishing. After thinning to form the bottom 124 of the IC chip 111, a portion of the substrate 120 (shown by reference numeral 241) remains between a bottom of the blind-vias 140 and the bottom 124 of the interposer 104.

FIG. 3A illustrates an enlarged cross sectional view of the conductive via 134 from the low via density region 132, according to an embodiment of the invention. The conductive via 134 has a dielectric layer 271 lining a sidewall of the TSV 130. The lined TSV 130 is filled with a conductive material 270. A lower end 302 of the conductive via 132 is exposed to the bottom 124 of the interposer 104 to facilitate electrical connection of the conductive via 132 of the interposer 104 to the packaging substrate structure 106 using the bottom wires 152. The top end 304 of the conductive via 132 is exposed to the top 204 of the substrate 120 to facilitate coupling the packaging substrate structure 106 to the IC chips 111, 113 (not shown) through the top wires 150 formed in the interconnect layer 154.

FIG. 3B illustrates an enlarged cross sectional view of the decaps 144 from the high via density region 142, according to an embodiment of the invention. The decaps 144 has a dielectric layer 271 lining a sidewall of the blind-via 140. The lined blind-via 140 is filled with a conductive material 270. A lower end 306 of the decaps 144 is spaced from the bottom 124 of the interposer 104 by the distance 241. The top end 308 of the decaps 144 is exposed to the top 204 of the substrate 120 and may be electrically coupled to the top wires 150 formed in the interconnect layer 154. The decaps 144 provide a conductive charge reservoir within the substrate 120/interposer 104 to enhance interconnection performance.

In other words, each decaps 144 is configured as a passive two-terminal electrical component for the storage of energy within the interposer 104. In one embodiment, the decaps 144 are electrically connected to the circuits and devices within the interposer 104, thereby functioning as decoupling capacitors (decaps) for the circuits thereby speeding the switching speed of current passing through the conductive vias 134, thereby enhances device performance.

Figure 4:
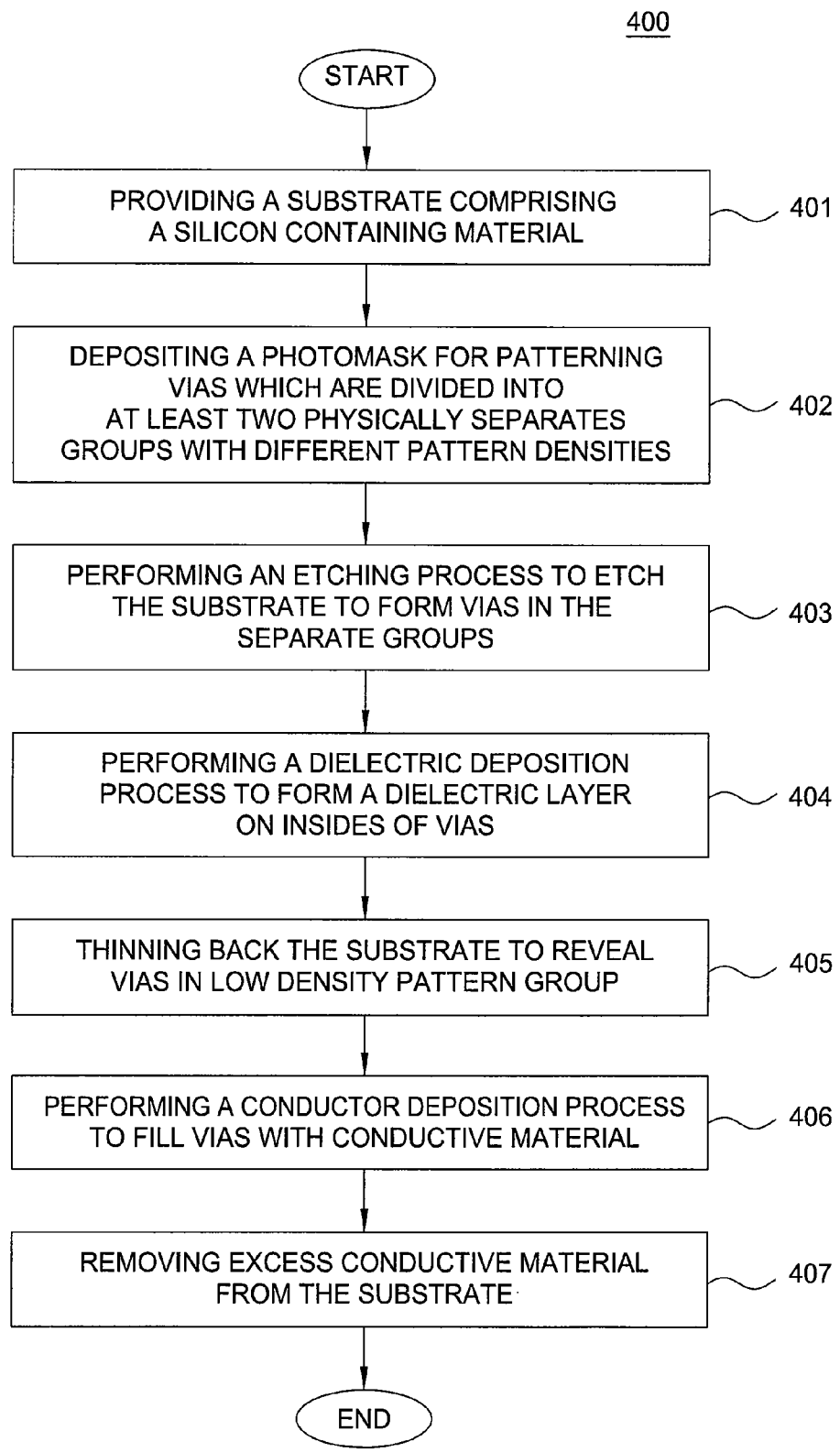
FIG. 4 sets forth a flowchart of method steps for creating decaps in blind-vias from a high density via region of a substrate, according to an embodiment of the invention.

FIG. 4 sets forth a flowchart of a method 400 for creating decaps in blind-vias formed in a high density via region, according to an embodiment of the invention. The method 400 may be extended to form a packaged semiconductor structure or even a computer system having a packaged semiconductor device 100. The steps described below for the method 400 need not necessarily be sequentially formed. The method 400 begins at step 401 in which a substrate comprising a silicon containing material is provided. At step 402, a photomask is deposited for patterning silicon vias which are divided into at least two physically separate groups (e.g., regions) with different pattern densities. The pattern densities are distinguished by regions of high density for vias and regions of low density of vias as described above.

At step 403, the silicon containing substrate is etched through openings formed in the photomask form vias in the separate groups (e.g., regions). During etching, the microloading effect causes TSVs 130 and blind-vias 140 to be formed respectively in the regions 132, 142. In one embodiment, the etching process may be a dry (i.e., plasma) etching method utilizing ions, or a plasma of reactive gases, to remove silicon material through the pattern of openings formed in the photomask. The microloading effect during etching results in longer TSVs 130 in the low density region 132 and blind-vias 140 in the high density region 142.

At step 404, a deposition process of dielectric material is performed to line the vias 130, 140 with a layer of dielectric material. In one embodiment, the dielectric material is silica. The dielectric material conformally coats the inside walls of the TSVs 130, and conformally coats the inside walls and bottom 306 the blind-vias 140.

At step 405, the substrate 120 is thinned back from the bottom 206 of the substrate 120 to reveal the TSVs 130 in the low density pattern region 132. The thin-back line 250, or amount of material removed as indicated by distance 242, is selected as not to expose the blind-vias 140. The substrate 120 may be thinned back using a suitable material removal technique, such as chemical mechanical polishing.

At step 406, a conductor deposition process is performed to fill the lined vias 130, 140 with a conductive material 270. The filled TSVs 130 now form the conductive via 134 from the top 204 of the substrate 120 to the bottom 124 of the interposer 104. The blind-vias 140 now have the characteristics two conductive materials separated by an insulating material, thereby forming the decaps 144. The decaps 144 are useful for storing and regulating energy and respond very quickly to fluctuations in the power supplied to the interposer 104, thereby improving the interconnection electrical performance.

At step 407, the top 204 of the substrate 120 is processed, for example by a chemical mechanical polishing process, to remove or clear conductive material 270 which may extend beyond the vias 130, 140 and be disposed on the top 204 of the substrate 120.

Subsequent steps not illustrated in the method 400 include forming the interconnect layer 154 on the top 204 of the substrate 120, mounting the interposer 104 on the packaging substrate structure 106, mounting the packaging substrate structure 106 on the PCB 102 and forming a computer system by coupling the PCB 102 with packaged semiconductor device 100 to memory or other computing system.

Figure 5:
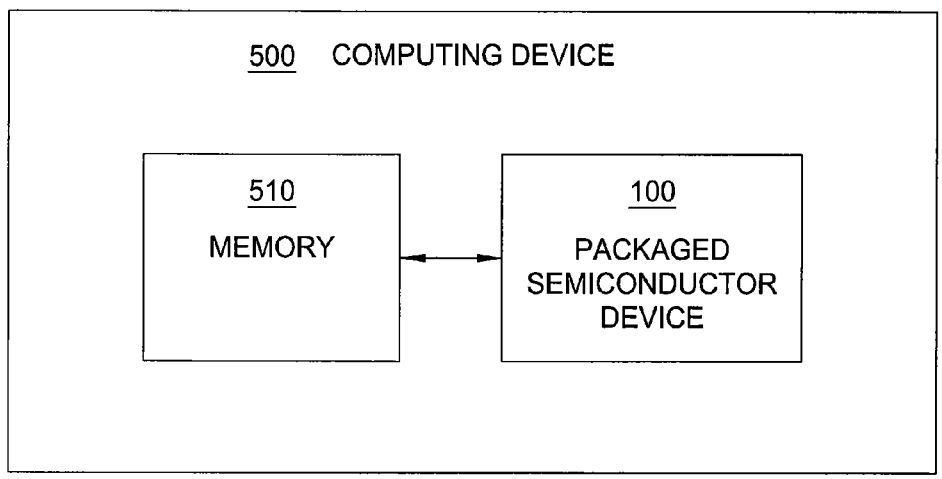
FIG. 5 illustrates a computing device in which one or more embodiments of the present invention can be implemented.

FIG. 5 illustrates a computer system 500 in which one or more embodiments of the present invention can be implemented. Specifically, FIG. 5 is a schematic diagram of the computer system 500 having the packaged semiconductor device 100 configured according to an embodiment of the present invention coupled with memory 510. The computer system 500 may be a desktop computer, a laptop computer, a smartphone, a digital tablet, a personal digital assistant, or other suitable computing device. Memory 510 may include one or more of volatile, non-volatile, and/or removable memory elements, such as random access memory (RAM), read-only memory (ROM), a magnetic or optical hard disk drive, a flash memory drive, and the like. Packaged semiconductor device 100 includes an interposer 104 with TSVs having decaps formed in blind vias as described above.

Accordingly, the blind-vias 140 disposed in high density regions 142 take advantage of the microloading effect while simultaneously forming TSVs 130 in low density regions 132. The blind-vias 140 are used to form the desirable decaps 144 for the devices formed in the interposer 104. The manufacturing operations take advantage of the techniques described above to form the decaps 144 during existing manufacturing operations, i.e., without the need for dedicated fabrication steps to form decaps separately from the formation of the conductive vias.

While the foregoing is directed to embodiments of the present invention, other and further embodiments of the invention may be devised without departing from the basic scope thereof, and the scope thereof is determined by the claims that follow.

What is claimed is:

1. An interposer suitable for use in a packaging substrate, comprising:
   a substrate comprising a silicon material, a bottom surface of the substrate defining a PCB mounting surface;
   an interconnect layer disposed on the substrate, the interconnect layer comprising conductive and dielectric layers patterned to form a plurality of top wires, a top surface of the interconnect layer defining a chip mounting surface;
   a plurality of through-vias formed through the substrate in an isolated region of the substrate, at least one of the plurality of conductive vias electrically coupled to at least one of the top wires;
   a plurality of blind-vias formed through the substrate in a dense region of the substrate, the through-vias and blind vias formed during a common etching step, at least one blind-via comprising:
   (a) a dielectric material lining the blind-vias; and
   (b) a conductive material filling the lined blind-vias and forming a decoupling capacitor.

2. The interposer of claim 1, wherein the substrate in the dense region comprises p-doped silicon.

3. The interposer of claim 1, wherein the dielectric material lining the blind-vias comprise silica and the conductive material filling the lined blind-vias comprises copper.

4. A packaged semiconductor structure comprising:
   a packaging substrate;
   an interposer disposed on the packaging substrate;
   at least a first IC chip mounted on and electrically coupled to the interposer, the interposer comprising:
   a substrate comprising a silicon material, a bottom surface of the substrate defining a PCB mounting surface;
   an interconnect layer disposed on the substrate, the interconnect layer comprising conductive and dielectric layers patterned to form a plurality of top wires, a top surface of the interconnect layer defining a chip mounting surface;
   a plurality of through-vias formed through the substrate in an isolated region of the substrate, at least one of the plurality of conductive vias electrically coupled to at least one of the top wires;
   a plurality of blind-vias formed through the substrate in a dense region of the substrate, the through-vias and blind vias formed during a common etching step, at least one blind-via comprising:
   (a) a dielectric material lining the blind-vias; and
   (b) a conductive material filling the lined blind-vias and forming a decoupling capacitor.

5. The package semiconductor structure of claim 4, wherein the substrate in the dense region comprises p-doped silicon.

6. The package semiconductor structure of claim 4, wherein the dielectric material lining the blind-vias comprise silica and the conductive material filling the lined blind-vias comprises copper.

7. The package semiconductor structure of claim 6 further comprising:
   a second IC chip mounted on the top surface of the interposer positioned in a side-by-side configuration to the first IC chip and electrically coupled to the top wires formed in the interconnect layer.

8. A method for forming a structure having decoupling capacitors, the method comprising:
   performing an etching process to form vias in a plurality of regions of a silicon substrate, at least a first region having a via density per unit area greater than a second region;
   lining the vias with a dielectric material;
   depositing a conductive material to fill the lined vias; and
   thinning back the substrate to form conductive vias extending from a top of the substrate to a bottom of the substrate in the second region, and to form decaps in blind-vias in the first region.

9. The method of claim 8 further comprising:
   clearing conductive material from the top of the substrate.

10. The method of claim 8 further comprising:
    forming an interconnect layer on the substrate, the interconnect layer comprising conductive and dielectric layers patterned to form a plurality of top wires, at least one top wire electrically coupled to at least one of the conductive vias.

11. The method of claim 10 further comprising:
    mounting an IC chip on the interconnect layer, the IC chip electrically coupled to at least one of the conductive vias.

12. The method of claim 10 further comprising:
    mounting the substrate to a packaging substrate, the packaging substrate electrically coupled with the top wires by the conductive vias.

13. The method of claim 12 further comprising:
    mounting the packaging substrate to a PCB, the PCB electrically coupled with the conductive vias through the packaging substrate.

14. The method of claim 8, wherein depositing the conductive material to fill the lined vias comprises filling the lined vias with copper.

15. The method of claim 14, wherein lining the vias with the dielectric material comprises lining the vias with silica.

* * * * *